United States Patent
Chien et al.

(10) Patent No.: US 9,525,402 B1
(45) Date of Patent: Dec. 20, 2016

(54) VOLTAGE MODE TRANSMITTER

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Ting-Hsu Chien, Yilan County (TW); Chen-Yang Pan, Taipei (TW); Jeng-Hung Tsai, Santa Clara, CA (US)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/857,839

(22) Filed: Sep. 18, 2015

(30) Foreign Application Priority Data

Jul. 8, 2015 (CN) .......................... 2015 1 0396948

(51) Int. Cl.
*H03K 17/00* (2006.01)
*H03K 3/013* (2006.01)

(52) U.S. Cl.
CPC ................... *H03K 3/013* (2013.01)

(58) Field of Classification Search
CPC .... H03K 19/0036; H03K 17/693; H03K 5/08; H04L 25/028; H04L 1/0003; H04L 1/0618; H04L 25/03343; H04L 27/10; H04L 27/2035; H04B 3/32; H03F 1/3276; H03F 1/3247; G06G 7/28
See application file for complete search history.

(56) References Cited

U.S. PATENT DOCUMENTS

| | | | |
|---|---|---|---|
| 6,690,744 B2 | 2/2004 | Hedberg | |
| 8,183,893 B2 * | 5/2012 | Kojima | H04L 25/028 327/108 |
| 9,444,659 B2 * | 9/2016 | Chien | H04L 25/085 |
| 2008/0063091 A1 | 3/2008 | Dong et al. | |
| 2015/0319014 A1 * | 11/2015 | Chien | H04L 25/085 375/296 |

FOREIGN PATENT DOCUMENTS

| | | |
|---|---|---|
| CN | 102292915 A | 12/2011 |
| TW | 486877 | 5/2002 |

* cited by examiner

*Primary Examiner* — Long Nguyen
(74) *Attorney, Agent, or Firm* — CKC & Partners Co., Ltd.

(57) ABSTRACT

A voltage mode transmitter is provided. The voltage mode transmitter includes a control unit and a resistor ladder circuit. The control unit receives a first signal and delays an inverse of the first signal for a time period to obtain a second signal. The resistor ladder circuit is configured to sum up products of the first signal or the second signal and a plurality of weights, thereby generating an output signal. The resistor ladder circuit includes an input terminal, multiple first resistors and a second resistor. The output terminal is configured to output the output signal. Each of the first resistors is coupled between the output terminal and the control unit and receives the first signal or the second signal. The resistances of the first resistors are 2R, 4R . . . and $2^n$R respectively, where R is a reference resistance. The resistance of the second resistor is $2^n$R.

10 Claims, 10 Drawing Sheets

VOLTAGE MODE TRANSMITTER

RELATED APPLICATIONS

This application claims priority to China Application Serial Number 201510396948.8 filed Jul. 8, 2015, which is herein incorporated by reference.

BACKGROUND

Field of Disclosure

The invention relates to a voltage mode transmitter, and more particularly, to a voltage mode transmitter including a resistor ladder circuit.

Description of Related Art

Nowadays, a current mode transmitter or a voltage mode transmitter is generally used as the signal transmitter of a high-speed transmission interface. Referring to FIG. 1A, FIG. 1A is a schematic diagram showing a current mode transmitter 110 and a current mode signal receiver 120. The current mode transmitter 110 includes a current source 111 having a current I1, transistors T1 and T2 forming a differential pair, a resistor R1 and a resistor R2. The current mode signal receiver 120 includes a resistor R3 and a resistor R4, in which resistance values of the resistor R1-R4 are all equal to R. The transistors T1 and T2 are respectively controlled by a differential signal D1 and a differential signal D2. When the transistor T1 is turned on by the differential signal D1 and the transistor T2 is turned off by the differential signal D2, the current of I1 passes through the transistor T1, in which a current of I1/2 flows to the transistor T1 through the resistor R3 and a channel CH1 of the current mode signal receiver 120, so as to enable the resistor R3 in the current mode signal receiver 120 to generate a voltage drop of (R×I1)/2.

In another aspect, referring to FIG. 1B, FIG. 1B is a schematic diagram showing a voltage mode transmitter 130 and a voltage mode signal receiver 140. The voltage mode transmitter 130 includes a transistor T3, a transistor T4, a transistor T5 and a transistor T6. The voltage mode signal receiver 140 includes a resistor R5. When the transistors T3 and T6 are turned on by the differential signals D3 and D4, a current of I2 flows to the resistor R5 (a resistance value of which is equal to 2R) in the voltage mode signal receiver 140 through a channel CH1 and then flows to the transistor T6 of the voltage mode transmitter 130 through a channel CH2 to enable the resistor R5 in the voltage mode signal receiver 140 to generate a voltage drop of 2R×I2.

When the resistors of the current mode signal receiver 120 and the voltage mode signal receiver 140 have the same voltage drops, i.e., (R×I1)/2=2R×I2; I1=4×I2, to enable the voltage mode transmitter 130 and the voltage mode signal receiver 14 to have the same signal strength, the voltage mode transmitter 130 consumes a smaller current. Therefore, the voltage mode transmitter 130 has an advantage of low power consumption in comparison with the current mode transmitter 110.

In another aspect, channels between a signal transmitter and a signal receiver cause frequency-dependent attenuation, and the frequency-dependent attenuation causes Inter-symbol-interference (ISI). Referring to FIG. 2, FIG. 2 is a schematic diagram showing output signals Vo1, Vo2 passing through channels CH1 and CH2 and input signals Vi1, Vi2. Taking the voltage mode transmitter and the voltage mode signal receiver as an example, the channels CH1 and CH2 are used to connect the voltage mode transmitter with the voltage mode signal receiver, and each of the channels CH1 and CH2 is actually similar to a low-pass filter. In other words, high frequency portions of the output signal Vo1 and the output signal Vo2 of the voltage mode transmitter 130 are greatly attenuated after passing through the channels CH1 and CH2, and low frequency portions of the output signals Vo1 and Vo2 are slightly attenuated after passing through the channels CH1 and CH2. As shown in FIG. 2, when the output signals Vo1 and Vo2 of the voltage mode transmitter are square waves and pass through the channels CH1 and CH2, they are changed to the input signals Vi1 and Vi2 of the voltage mode signal receiver, in which high frequency portions of the input signals Vi1 and Vi2 has been attenuated, and a serious signal distortion is raised accordingly. Therefore, how to avoid the signal distortion of a high frequency portion of a signal is one of the current research and development topics.

SUMMARY

In order to solve the aforementioned problems, one aspect of the present invention is related to a voltage mode transmitter. The voltage mode transmitter includes a control unit and a resistor ladder circuit. The control unit is configured to receive a first signal and delay an inverse of the first signal for a time period to obtain a second signal. The resistor ladder circuit is configured to sum up products of the first signal or the second signal and a plurality of weights, thereby generating an output signal. The resistor ladder circuit includes an output terminal, a plurality of first resistors and a second resistor. The output terminal is configured to output the output signal. Each of the first resistors is electrically coupled between the output terminal and the control unit, and receives the first signal or the second signal, and the second resistor is electrically coupled between the output terminal and a ground terminal, in which resistance values of the first resistors are 2R, 4R . . . and $2^n$R respectively, and a resistance value of the second resistor is $2^n$R, and n is a positive integer greater than 1 and R is a reference resistance.

In an embodiment, the control unit includes an inverter and a delay unit. The first signal is changed to the second signal after passing through the inverter and the delay unit.

In another embodiment, the control unit further includes selection units, each of which provides the first signal or the second signal to a corresponding one of the first resistors according to a selection signal.

In further another embodiment, each of the selection units is a switch unit or a multiplexer.

In still another embodiment, the voltage mode transmitter is a single-ended voltage mode transmitter, and transmits the output signal to a single-ended signal receiver through a channel.

An aspect of the present invention is related to a voltage mode transmitter. The voltage mode transmitter includes a first control unit, a first resistor ladder circuit, a second control unit and a second resistor ladder circuit. The first control unit is configured to receive a first signal and delay an inverse of the first signal for a time period to obtain a second signal. The first resistor ladder circuit is configured to sum up products of the first signal or the second signal and a plurality of weights, thereby generating a first output signal. The second control unit is configured to receive a third signal and delay an inverse of the third signal for a time period to obtain a fourth signal. The second resistor ladder circuit is configured to sum up products of the third signal or the fourth signal and a plurality of weights, thereby generating a second output signal. The second resistor ladder circuit includes an output terminal, a plurality of first resistors and a second resistor. The output terminal is configured to output the second output signal. Each of the first resistors is electrically coupled between the output terminal and the second control unit, and receives the third signal or the fourth signal, wherein resistance values of the first resistors are 2R, 4R . . . and $2^n$R respectively. The second resistor is electrically coupled between the output terminal and a ground terminal, and a resistance value of the second resistor is $2^n$R, and n is a positive integer greater than 1 and R is a reference resistance.

In an embodiment, the second control unit includes an inverter and a delay unit. The third signal is changed to the fourth signal after passing through the inverter and the delay unit.

In another embodiment, the second control unit further includes a plurality of selection units, each of which provides the third signal or the fourth signal to a corresponding one of the first resistors according to a selection signal.

In further another embodiment, each of the selection units is a switch unit or a multiplexer.

In still another embodiment, the voltage mode transmitter is a differential voltage mode transmitter, and transmits the first output signal and the second output signal to a differential signal receiver through a first channel and a second channel.

As mentioned above, the voltage transmitters provided by the embodiments of the present invention can not only compensate for the high frequency distortion caused by channels, but also properly adjust the output signals with respect to different channels.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
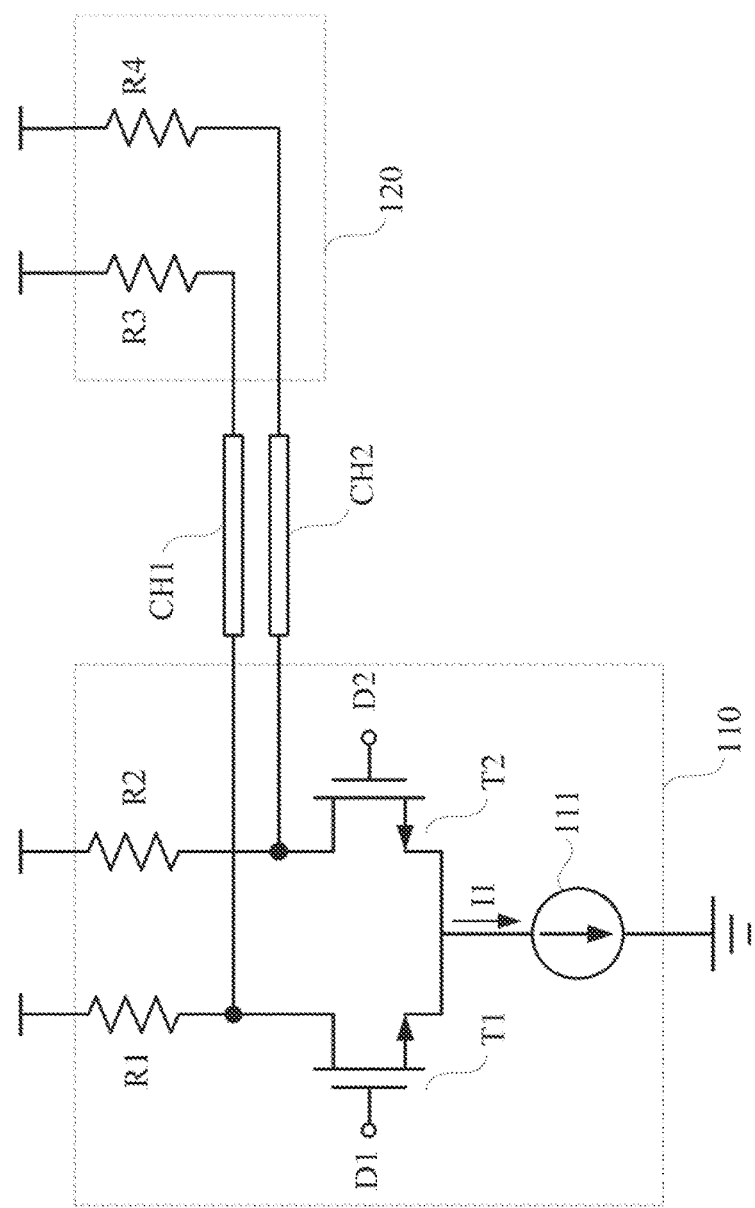
FIG. 1A is a schematic diagram showing a current mode transmitter and a current mode signal receiver.
Figure 1B:
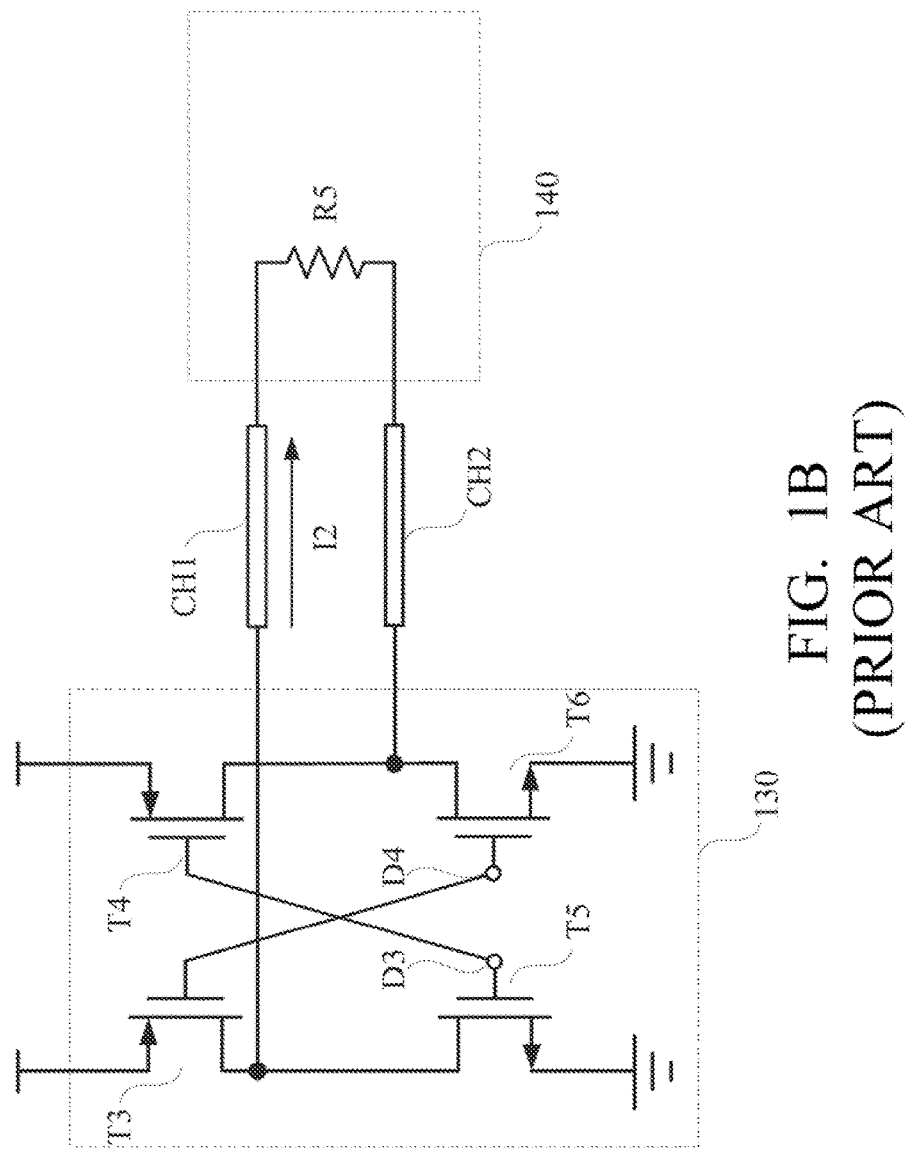
FIG. 1B is a schematic diagram showing a voltage mode transmitter and a voltage mode signal receiver.
Figure 2:
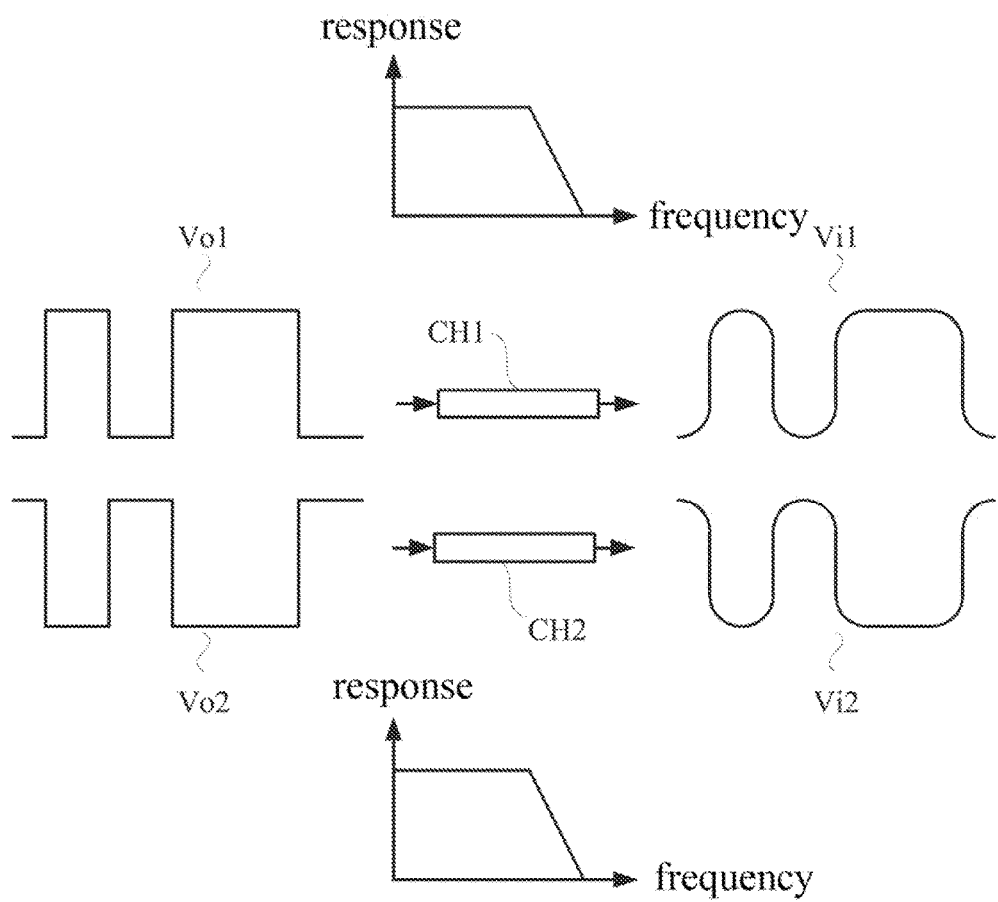
FIG. 2 is a schematic diagram showing output signals channels and input signals.

The present invention will now be described more fully hereinafter with reference to the accompanying drawings, in which preferred embodiments are shown. However, this invention will be embodied in many different forms and should not be construed as limited to the embodiments set fourth herein. These embodiments are provided so that this disclosure will be through and complete, and will fully convey the scope of the invention to those skilled in the art. Like reference numerals refer to like elements throughout.

It will be understood that, although the terms first, second, third etc. may be used herein to describe various elements. However, these elements should not be limited by these terms. These terms are only used to distinguish one element, component, region, layer or section from another element, component, region, layer or section. Therefore, a first element maybe called a second element in the following descriptions without departing from the spirit of the present invention.

It will be understood that when an element is referred to as being "connected" or "coupled" to another element, it can be directly connected or coupled to the other element or intervening elements may be present.

Figure 3A:
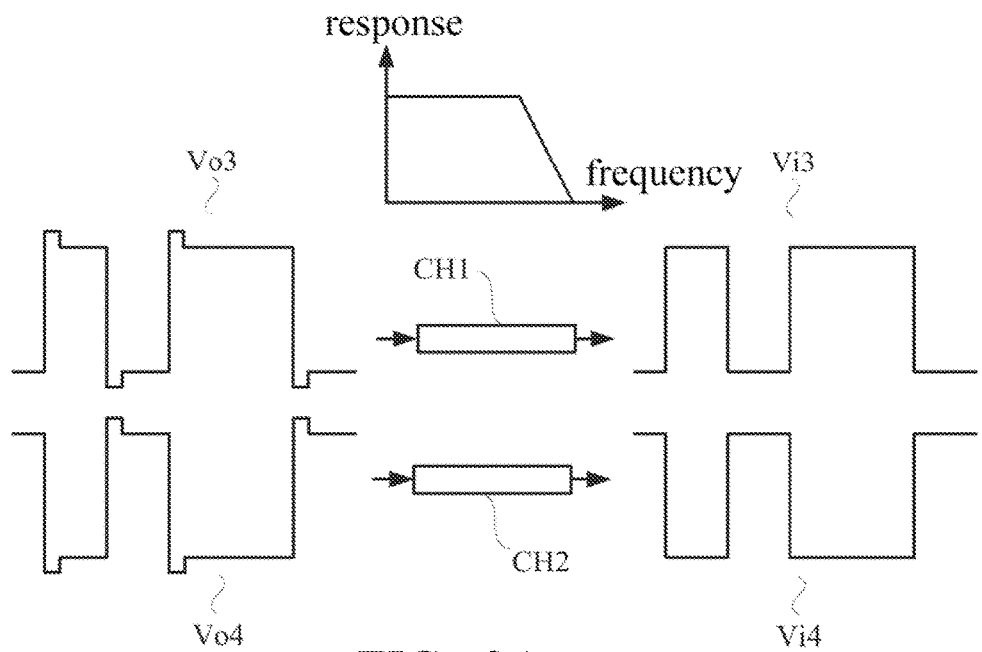
FIG. 3A is a schematic diagram showing output signals passing through channels and input signals.
Figure 3B:
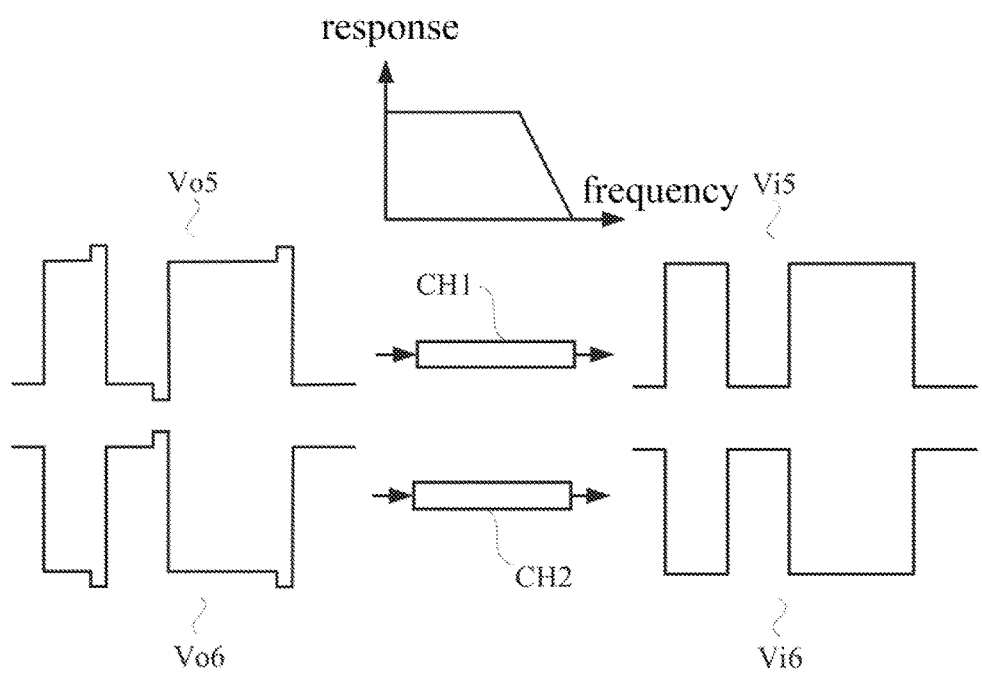
FIG. 3B is a schematic diagram showing output signals passing through channels and input signals.

Referring to FIG. 3A together with FIG. 3B, FIG. 3A and FIG. 3B are schematic diagrams respectively showing output signals Vo3-Vo6 passing through channels CH1, CH2 and input signals Vi3-Vi6, in which the output signals Vo3-Vo6 are signals outputted by a signal transmitter, and the input signals Vi3-Vi6 are signals inputted to a signal receiver. In a general environment of wired transmission, the channels CH1 and CH2 often have a low-pass frequency response.

In comparison with the output signals Vo1 and Vo2, high frequency portions of the output signals Vo3 and Vo4 in FIG. 3a and high frequency portions of the output signals Vo5 and Vo6 in FIG. 3b are enhanced. Therefore, after the output signals Vo3, Vo5 and output signals Vo4, Vo6 respectively pass through the channels CH1 and CH2, the input signals Vi3, Vi5 and the input signals Vi4, Vi6 are generated. In comparison with the input signal Vi1 and Vi2, the input signals Vi3, Vi5 and the input signals Vi4, Vi6 have a lower signal distortion rate. In some embodiments, the output signals Vo3, Vo4 have a waveform property of de-emphasis, and the output signals Vo5, Vo6 have a waveform property of preshoot.

Figure 4A:
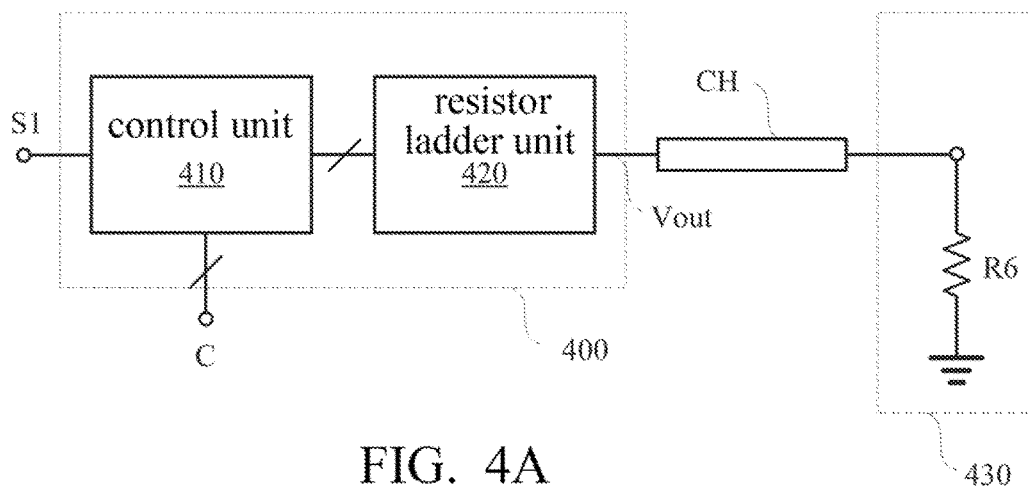
FIG. 4A is a schematic diagram showing a voltage mode transmitter and a voltage mode signal receiver according to an embodiment of the present invention.
Figure 4B:
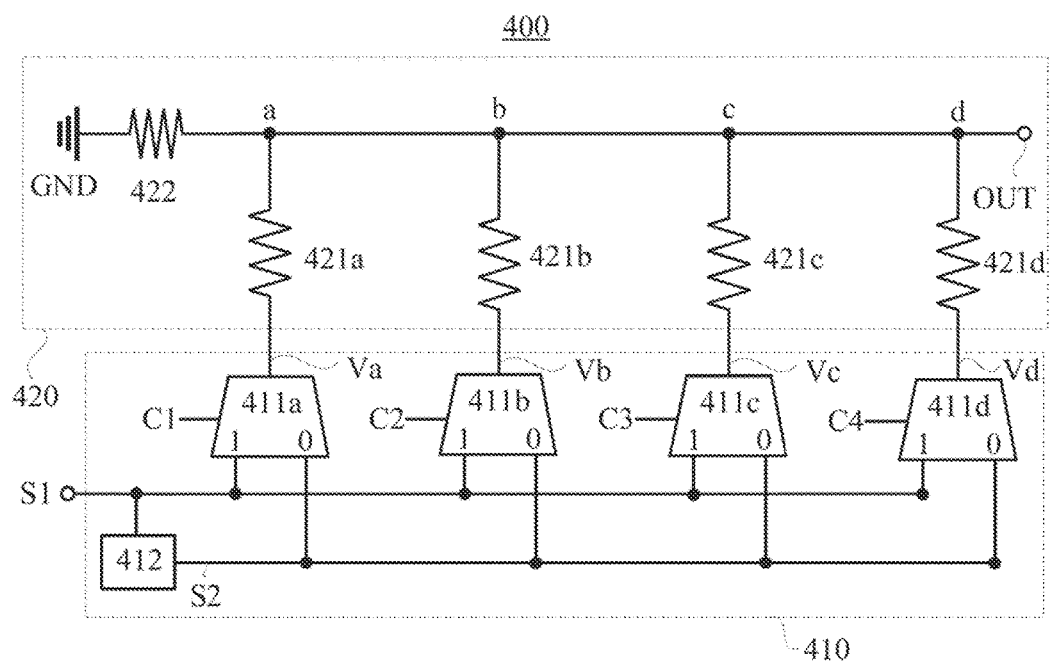
FIG. 4B is a schematic diagram showing the voltage mode transmitter according to an embodiment of the present invention.

Referring to FIG. 4A together with FIG. 4B to achieve the waveforms shown in FIG. 3A and FIG. 3B. FIG. 4A is a schematic diagram showing a voltage mode transmitter 400 and a voltage mode signal receiver 430 according to an embodiment of the present invention. The voltage mode transmitter 400 is configured to generate the waveforms of the output signals Vo3-Vo6 shown in FIG. 3A and FIG. 3B. In this embodiment, the voltage mode transmitter 400 is a single-ended voltage mode transmitter 400, and includes a control unit 410 and a resistor ladder circuit 420 electrically coupled to the control unit 410.

The control unit 410 receives a first signal S1 and a control signal C, and the control signal C can be used to determine signals outputted from the control unit 410 to the resistor ladder circuit 420, thereby enabling the resistor ladder circuit 420 to generate an output signal Vout having the waveform property of de-emphasis or preshoot. The output signal Vout is then transmitted to the voltage mode signal receiver 430 through a channel CH, in which the voltage mode signal receiver 430 includes a resistor R6.

Referring to FIG. 4B, FIG. 4B is a schematic diagram showing the voltage mode transmitter 400 according to an embodiment of the present invention. The control unit 410 of the voltage mode transmitter 400 includes a plurality of selection units 411a, 411b, 411c, 411d and a delay inversion unit 412. The delay inversion unit 412 is configured to perform an inverse function on and delay the first signal S1 to obtain a second signal S2. In other words, the second signal S2 is an inverse of the first signal S1, and the first signal S1 and the second signal S2 have a time period difference. Each of the selection units 411a, 411b, 411c and 411d receives the first signal S1 and the second signal S2. In addition, the selection units 411a, 411b, 411c and 411d are further configured to respectively receive control signals C1, C2, C3 and C4, and to determine output signals Va, Vb, Vc and Vd from the first signal S1 and the second signal S2, in which the control signal C in FIG. 4A includes the control signals C1, C2, C3 and C4, and voltage levels of the output signals Va, Vb, Vc and Vd can also be represented by the element references Va, Vb, Vc and Vd.

For example, when the control signal C1 is an enable signal (e.g., the control signal is at a high voltage level), the output signal Va of the selection unit 411a is the first signal S1. In contrast, when the control signal C1 is a disable signal I (e.g., the control signal is at a low voltage level), the output signal Va of the selection unit 411a is the second signal S2. In this embodiment, multiplexers are used as an example for implementing the selection units 411a, 411b, 411c and 411d, but the selection units 411a, 411b, 411 c and 411 d are not limited thereto.

In some embodiments, the selection units 411a, 411b, 411c and 411d can be implemented by a plurality of switch units.

The resistor ladder circuit 420 includes an output terminal OUT, first resistors 421a-421d and a second resistor 422. The output terminal OUT is configured to output the output signal Vout, in which a voltage level of the output signal Vout is also represented by the reference number Vout.

Each of the first resistors 421a-421d is electrically coupled between the output terminal OUT and the control unit 410, and is configured to receive the first signals S1 or the second signals S2 outputted by the selection units 411a, 411b, 411c and 411d, in which resistance values of the first resistors 421d, 421c, 421b and 421 are respectively equal to 2R, 4R, 8R and 16R. The second resistor 422 is electrically coupled between the output terminal OUT and a ground terminal GND, and a resistance value of the second resistor 422 is equal to 16R. In this embodiment, the number of the first resistors 421a-421d is exemplified by 4, but is not limited thereto. Therefore, when the number of the first resistors is n, the resistance values of the first resistors can be 2R, 4R ... and $2^n$R respectively, and the resistance value of the second resistor is $2^n$R, in which n is a positive integer greater than 1.

It is noted that equivalent resistors along a direction from a node a to the ground GND and a direction from the node a to the control unit 411a can be considered as the first resistor 421a and the second resistor 422 coupled in parallel, i.e., 8R. Regarding a node b, a resistance value of equivalent resistors along a direction to the ground GND and a direction to the control unit 411b can be considered to be 4R, i.e., 8R is coupled to the first resistor 421b in parallel. Regarding a node c, a resistance value of equivalent resistors along a direction to the ground GND and a direction to the control unit 411c can be considered to be 2R, i.e., 4R is coupled to the first resistor 421c in parallel. Regarding a node d, a resistance value of equivalent resistors along a direction to the ground GND and a direction to the control unit 411d can be considered to be R, i.e., 2R is coupled to the first resistor 421d in parallel. Therefore, an output resistance of the voltage mode transmitter 400 is equal to R. In another aspect, it can be understood from the aforementioned connection relationship that a relationship between the output signal Vout of the output terminal OUT and the four output signals Va, Vb, Vc and Vd of the selection units 411a, 411b, 411c and 411d is Vout=(Va+2Vb+4Vc+8Vd)/16.

In some embodiments, R is equal to 50 ohm.

To sum up, through adjustment of the control signal C1, C2, C3 and C4, the four output signals Va, Vb, Vc and Vd of the control units 411a, 411b, 411c and 411d are effectively controlled, thereby enabling the output terminal OUT to output the output signal Vout having the waveform property of de-emphasis or preshoot.

Figure 5A:
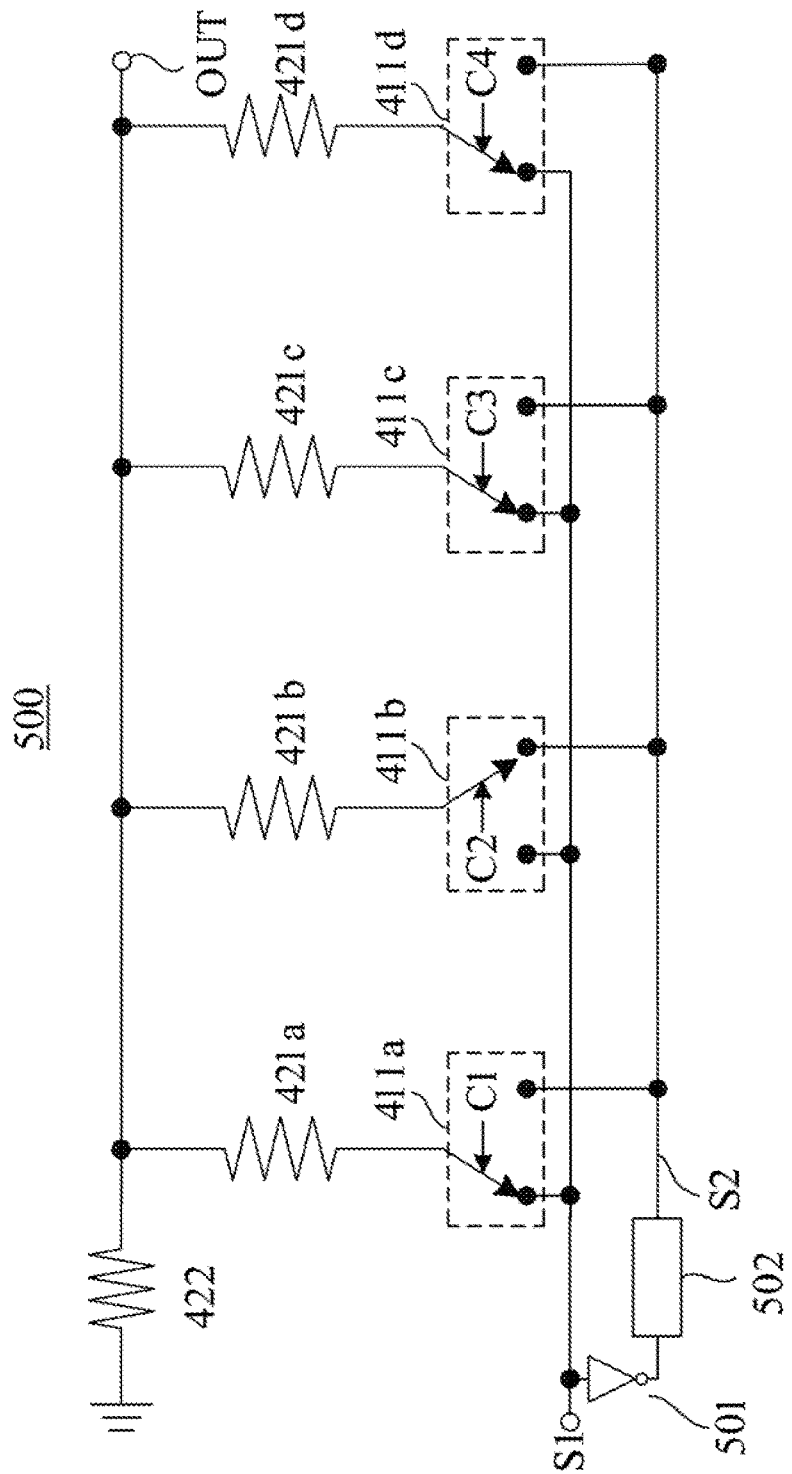
FIG. 5A is a schematic circuit diagram showing a voltage mode transmitter according to an embodiment of the present invention.
Figure 5B:
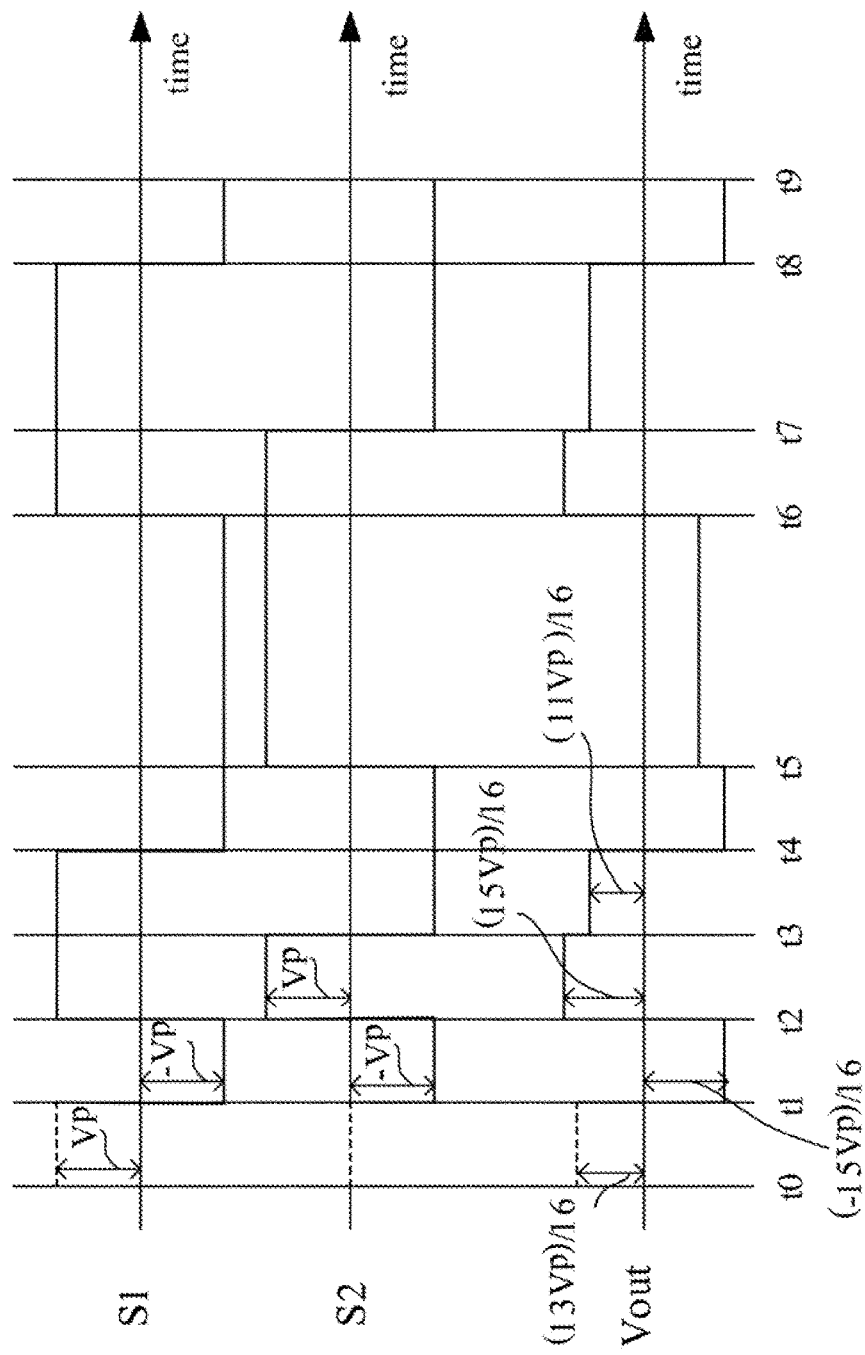
FIG. 5B is a schematic diagram showing time sequences of signals of the voltage mode transmitter according to an embodiment of the present invention.

Referring to FIG. 5A together with FIG. 5B, FIG. 5A is a schematic circuit diagram showing a voltage mode transmitter 500 according to an embodiment of the present invention. In comparison with the delay inversion unit 412 in FIG. 4B, the delay inversion unit 412 in FIG. 5A further includes an inverter 501 and a delay unit 502. The inverter 501 is configured to perform an inverse function on the first signal S1, and the delay unit 502 is configured to delay the inverse first signal S1 for a time period to obtain the second signal S2. The selection unit 411a, the selection unit 411c and the selection unit 411d output the first signals S1 by the control signals C1, C3 and C4, and the selection unit 411b outputs the second signal 32 by the control signal C2. Through the above settings, the output signal Vout of the voltage mode transmitter 500 has the waveform property of de-emphasis.

Referring to FIG. 5B, FIG. 5B is a schematic diagram showing time sequences of signals of the voltage mode transmitter 500 according to an embodiment of the present invention. In this embodiment, a high voltage level of the first signal S1 can be, for example Vp, and a low voltage level of the first signal S1 can be, for example −Vp, and a high voltage level and a low voltage level of the inverse and delayed second signal S2 can be, for example Vp and −Vp, respectively.

At first, in a time period between a time point t0 and a time point t1, a voltage level of the output signal Vout can be obtained from the following equation:

Vout=(Va+2Vb+4Vc+8Vd)/16=(S1+2×S2+4×S1+8× S1)/16=(Vp+2×0+4×Vp+8×Vp)/16=(13Vp)/16

In a time period between the time point t1 and a time point t2, a voltage level of the output signal Vout can be obtained from the following equation:

Vout=(Va+2Vb+4Vc+8Vd)/16=(S1+2×S2+4×S1+8× S1)/16=((−Vp)+2×(−Vp)+4×(−Vp)+8×(−Vp))/16= (−15Vp)/16

In a time period between the time points t2 and a time point t3, a voltage level of the output signal Vout can be obtained from the following equation:

Vout=(Va+2Vb+4Vc+8Vd)/16=(S1+2×S2+4×S1+8× S1)/16=(Vp+2×Vp+4×Vp+8×Vp)/16=(15Vp)/16

In a time period between the time point t3 and a time point t4, a voltage level of the output signal Vout can be obtained from the following function:

Vout=(Va+2Vb+4Vc+8Vd)/16=(S1+2×S2+4×S1+8× S1)/16=(Vp+2×(−Vp)+4×Vp+8×Vp)/16=(11Vp)/ 16

Variations of the output signal after the time point t4 (i.e., signal variations at the time point t4, a time point t5, a time point t6, a time point t7, a time point t8 and a time point t9) can be calculated by using equations similar to the aforementioned equations, and thus are not described again herein. It can be understood from FIG. 5A and FIG. 5B that the voltage mode transmitter 500 can enable the output signal Vout to have the waveform property of de-emphasis through the settings of the control signals C1, C2, C3 and C4.

It is noted that the settings of the control signals C1, C2, 03 and C4 are not limited to the above embodiments. For example, when the output signal Vout generated by the voltage mode transmitter 500 is desired to have a more significant waveform property of de-emphasis, the control signals C1, C2, C3 and C4 can be set to enable the selection unit 411a, the selection unit 411b and the selection unit 411d to output the first signals S1, and enable the selection unit 411d to output the second signal S2.

Figure 6A:
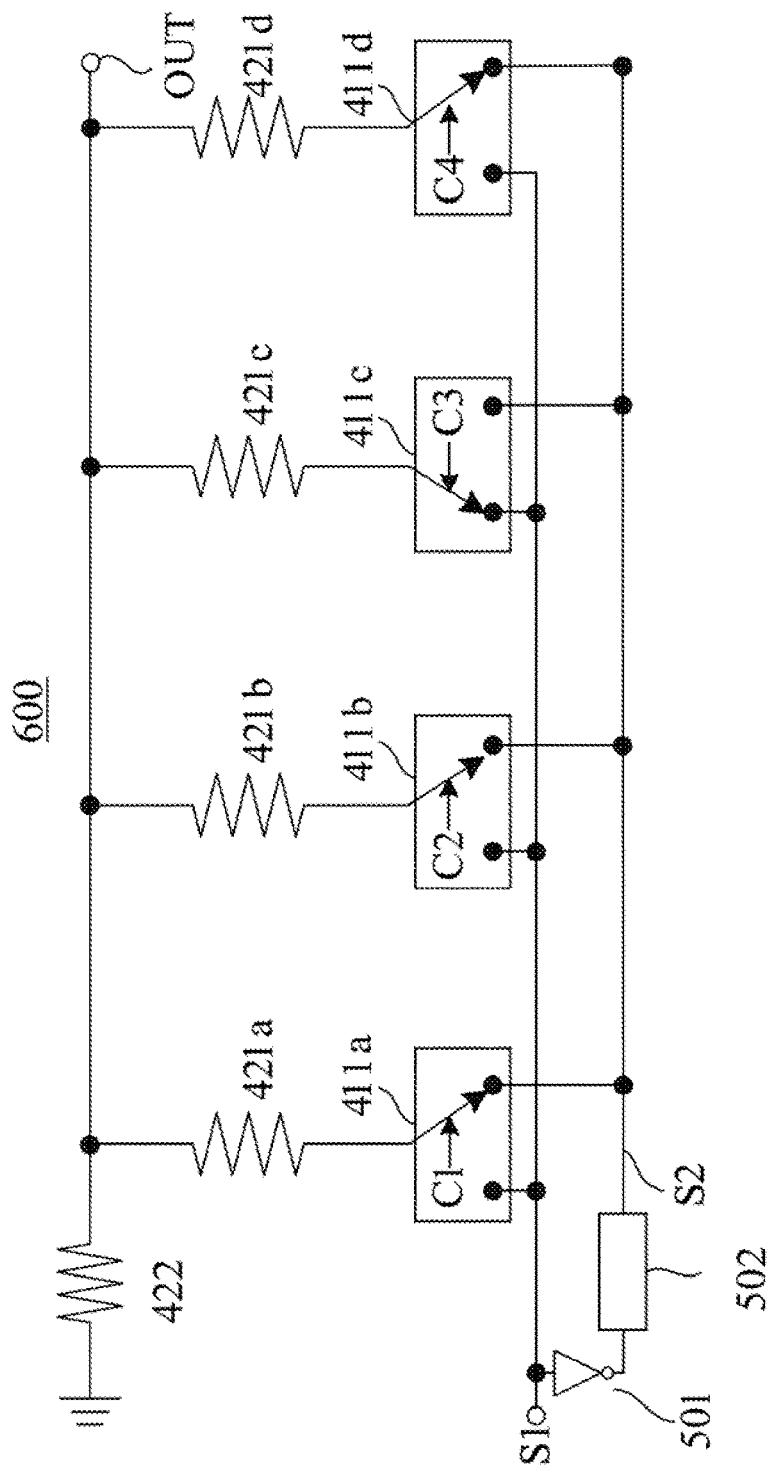
FIG. 6A is a schematic circuit diagram showing a voltage mode transmitter according to an embodiment of the present invention.
Figure 6B:
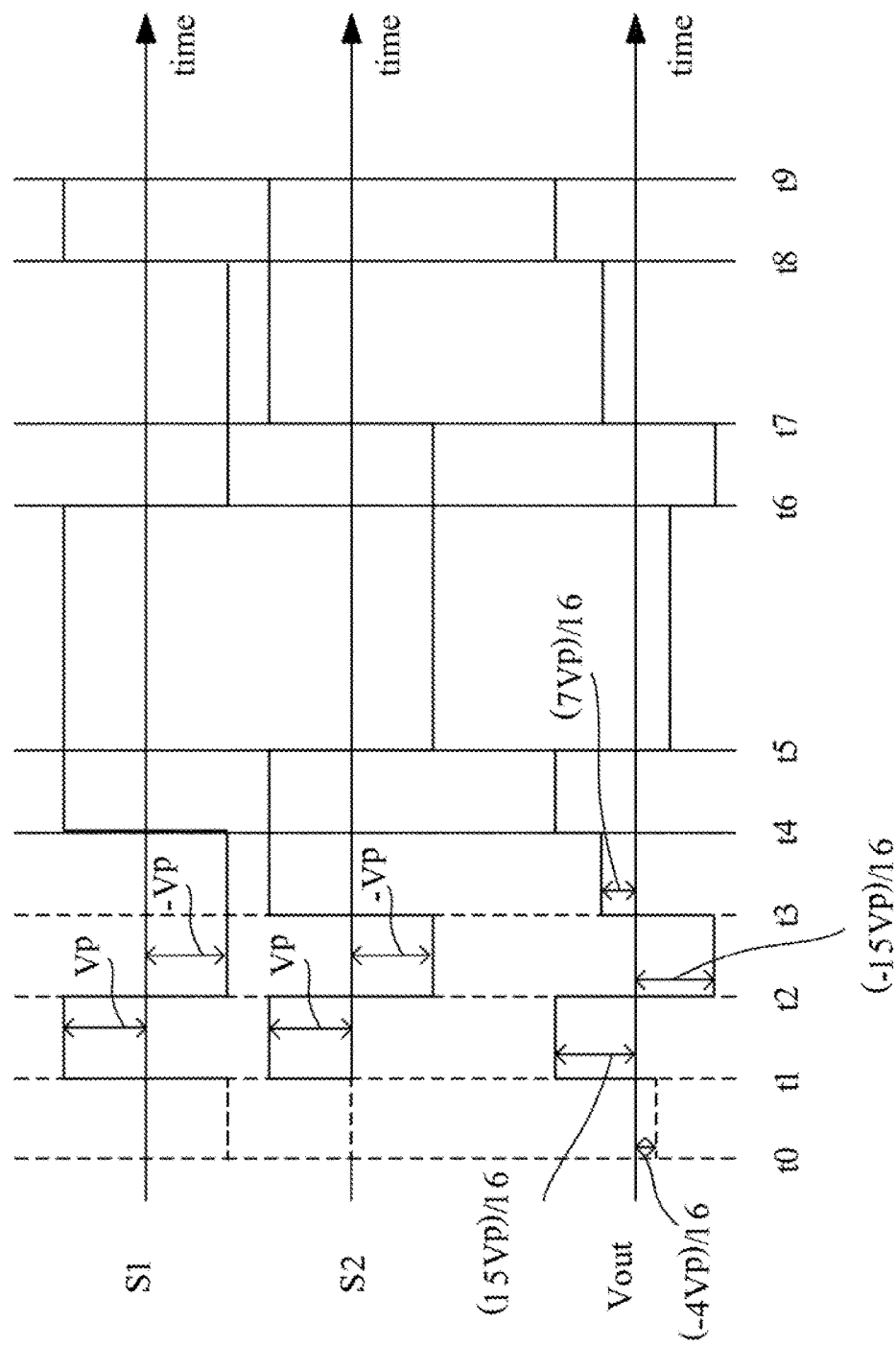
FIG. 6B is a schematic diagram showing time sequences of signals of the voltage mode transmitter according to an embodiment of the present invention.

Referring FIG. 6A together with FIG. 6B, FIG. 6A is a schematic circuit diagram showing a voltage mode transmitter 600 according to an embodiment of the present invention. In FIG. 6A, the second signal S2 is generated when the first signal S1 passes through the inverter 501 and the delay unit 502. The selection unit 411c outputs the first signal S1, and the selection unit 411a, the selection unit 411b and the selection unit 411d output the second signals S2. Through the above settings, the output signal of the voltage mode transmitter 600 has the waveform property of preshoot.

Referring to FIG. 6B, FIG. 6B is a schematic diagram showing time sequences of signals of the voltage mode transmitter 600 according to an embodiment of the present invention. In this embodiment, a high voltage level of the first signal S1 can be, for example Vp, and a low voltage level of the first signal S1 can be, for example −Vp. At first, in a time period between time points t0-t1, a voltage level of the output signal Vout can be obtained from the following function:

$$V\text{out}=(Va+2Vb+4Vc+8Vd)/16=(S2+2\times S2+4\times S1+\times S2)/16=(0+2\times 0+4\times(-Vp)+8\times 0)/16=(-4Vp)/16$$

In a time period between time points t1-t2, a voltage level of the output signal Vout can be obtained from the following function:

$$V\text{out}=(Va+2Vb+4Vc+8Vd)/16=(S2+2\times S2+4\times S1+8\times S2)/16=(Vp+2\times Vp+4\times Vp+8\times Vp)/16=(15Vp)/16$$

In a time period between time points t2-t3, a voltage level of the output signal Vout can be obtained from the following function:

$$V\text{out}=(Va+2Vb+4Vc+8Vd)/16=(S2+2\times S2+4\times S1+8\times S2)/16=((-Vp)+2\times(-Vp)+4\times(-Vp)+8\times(-Vp))/16=(-15Vp)/16$$

In a time period between time points t3-t4, a voltage level of the output signal Vout can be obtained from the following function:

$$V\text{out}=(Va+2Vb+4Vc+8Vd)/16=(S2+2\times S2+4\times S1+8\times S2)/16=(Vp+2\times Vp+4\times(-Vp)+8\times Vp)/16=(7Vp)/16$$

Variations of the output signal after the time point t4 (i.e., signal variations at the time point t4, a time point t5, a time point t6, a time point t7, a time point t8 and a time point t9) can be calculated by using functions similar to the above functions, and thus it is not repeated herein. It can be understood from FIG. 6A and FIG. 6B that the voltage mode transmitter 600 can enable the output signal Vout to have the waveform property of preshoot through the settings of the control signals C1, C2, C3 and C4.

It is noted that the settings of the control signals C1, C2, C3 and C4 are not limited to the above embodiments. For example, when the output signal Vout generated by the voltage mode transmitter 600 is desired to have a less significant waveform property of de-emphasis, the control signals C1, C2, C3 and C4 can be set to enable the selection unit 411a, the selection unit 411c and the selection unit 411d to output the second signals S2, and enable the selection unit 411b to output the first signal S1.

As mentioned above, the voltage mode transmitters 400, 500 and 600 can generate the output signals Vout having a waveform property of de-emphasis or preshoot to effectively compensate for a loss of a high frequency portion thereof when the output signals Vout pass through an actual channel, and enable the voltage mode signal receiver 430 to more correctly receive the signals transmitted by the voltage mode transmitters 400, 500 and 600.

Figure 7:
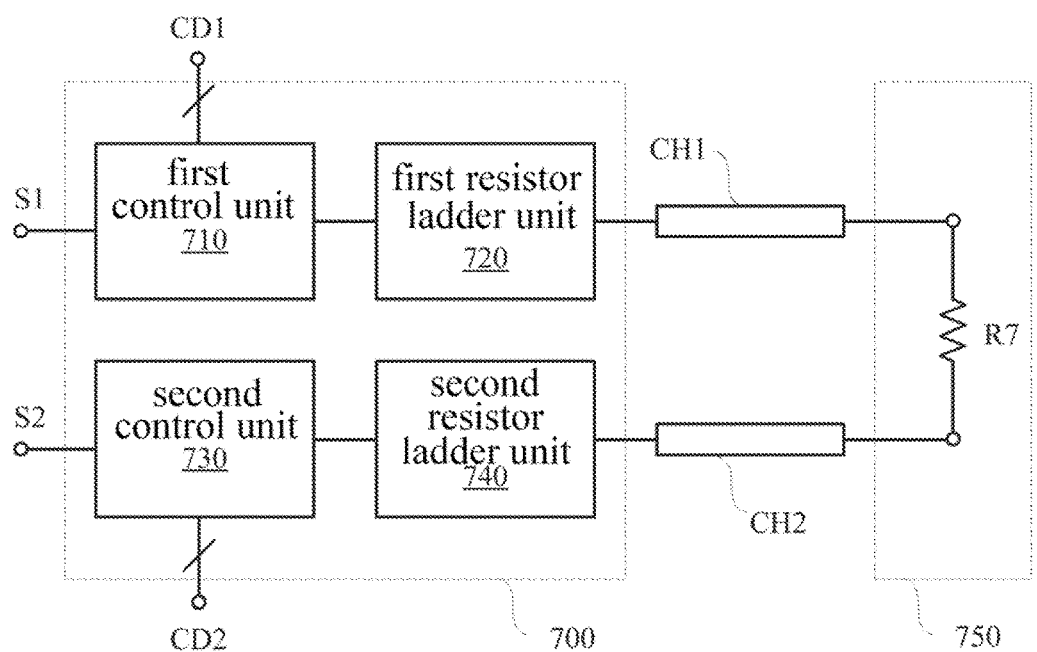
FIG. 7 is a schematic diagram showing a voltage mode transmitter and a voltage mode signal receiver according to an embodiment of the present invention.

Referring to FIG. 7, FIG. 7 is a schematic diagram showing a voltage mode transmitter 700 and a voltage mode signal receiver 750 according to an embodiment of the present invention. The voltage mode transmitter 700 includes a first control unit 710, a first resistor ladder circuit 720, a second control unit 730 and a second resistor ladder circuit 740. The voltage mode signal receiver 750 includes a resistor R7. The first control unit 710 is electrically coupled to the first resistor ladder circuit 720, and the second control unit 730 is electrically coupled to the second resistor ladder circuit 740. In comparison with the single-ended voltage mode transmitter 400 shown in FIG. 4A and FIG. 4B, the voltage mode transmitter 700 is a differential voltage mode transmitter, and thus inner structure of the first control unit 710 and the second control unit 730 is similar to that of the control unit 410, and inner structure of the first resistor ladder circuit 720 and the second resistor ladder circuit 740 is similar to that of the resistor ladder 420.

The first control unit 710 receives the first signal S1 (for example, a differential signal) and a control signal CD1, and the second control unit 730 receives the second signal S2 (for example, a differential signal) and a control signal CD2. The control signals CD1 and CD2 are used to respectively control the outputs of the first control unit 710 and the second control unit 730, thereby enabling output signals respectably outputted by the first resistor ladder circuit 720 and the second resistor ladder circuit 740 to have a waveform property of de-emphasis or preshoot. Therefore, the output signal of the voltage mode transmitter 700 can be effectively compensated for losses of high frequency portions caused by the channels CH1 and CH2, and transmitted to the voltage mode signal receiver 750 to enable the voltage mode signal receiver 750 to more correctly receive the signals transmitted by the voltage mode transmitters 700.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims.

What is claimed is:

1. A voltage mode transmitter, comprising:
   a control unit configured to receive a first signal and delay an inverse of the first signal for a time period to obtain a second signal; and
   a resistor ladder circuit configured to sum up products of the first signal or the second signal and a plurality of weights, thereby generating an output signal, the resistor ladder circuit comprising:
- an output terminal configured to output the output signal;
- a plurality of first resistors each of which is electrically coupled between the output terminal and the control unit, and receives the first signal or the second signal, wherein resistance values of the first resistors are 2R, 4R . . . and $2^n$R respectively, where R is a reference; and
- a second resistor electrically coupled between the output terminal and a ground terminal, wherein a resistance value of the second resistor is $2^n$R, where n is a positive integer greater than 1.

2. The voltage mode transmitter of claim 1, wherein the control unit comprises:
- an inverter; and
- a delay unit, wherein the first signal is changed to the second signal after passing through the inverter and the delay unit.

3. The voltage mode transmitter of claim 2, wherein the control unit further comprises:
- a plurality of selection units each of which provides the first signal or the second signal to a corresponding one of the first resistors according to a selection signal.

4. The voltage mode transmitter of claim 3, wherein the selection units are a plurality of switch units or a plurality of multiplexers.

5. The voltage mode transmitter of claim 1, wherein the voltage mode transmitter is a single-ended voltage mode transmitter, and transmits the output signal to a single-ended signal receiver through a channel.

6. A voltage mode transmitter, comprising:
- a first control unit configured to receive a first signal and delay an inverse of the first signal for a time period to obtain a second signal;
- a first resistor ladder circuit configured to sum up products of the first signal or the second signal and a plurality of weights, thereby generating a first output signal;
- a second control unit configured to receive a third signal and delay an inverse of the third signal for the time period to obtain a fourth signal;
- a second resistor ladder circuit configured to sum up products of the third signal or the fourth signal and the weights, thereby generating a second output signal, the second resistor ladder circuit comprising:
  - an output terminal configured to output the second output signal;
  - a plurality of first resistors each of which is electrically coupled between the output terminal and the second control unit, and receives the third signal or the fourth signal, wherein resistance values of the first resistors are 2R, 4R . . . and $2^n$R respectively, where R is a reference; and
  - a second resistor electrically coupled between the output terminal and a ground terminal, wherein a resistance value of the second resistor is $2^n$R, where n is a positive integer greater than 1.

7. The voltage mode transmitter of claim 6, wherein the second control unit comprises:
- an inverter; and
- a delay unit, wherein the third signal is changed to the fourth signal after passing through the inverter and the delay unit.

8. The voltage mode transmitter of claim 7, wherein the second control unit further comprises:
- a plurality of selection units, each of which provides the third signal or the fourth signal to a corresponding one of the first resistors according to a selection signal.

9. The voltage mode transmitter of claim 8, wherein the selection units are a plurality of switch units or a plurality of multiplexers.

10. The voltage mode transmitter of claim 6, wherein the voltage mode transmitter is a differential voltage mode transmitter, and transmits the first output signal and the second output signal to a differential signal receiver through a first channel and a second channel.

* * * * *